United States Patent
Kim et al.

(10) Patent No.: US 12,293,793 B2
(45) Date of Patent: May 6, 2025

(54) NON-VOLATILE MEMORY DEVICE, MEMORY SYSTEM INCLUDING THE SAME AND READ METHOD OF MEMORY SYSTEM

(71) Applicant: SK hynix Inc., Gyeonggi-do (KR)

(72) Inventors: Sung Hun Kim, Gyeonggi-do (KR); Hyo Jae Lee, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 18/666,819

(22) Filed: May 17, 2024

(65) Prior Publication Data

US 2024/0304260 A1 Sep. 12, 2024

Related U.S. Application Data

(63) Continuation of application No. 17/559,243, filed on Dec. 22, 2021, now Pat. No. 12,020,755.

(30) Foreign Application Priority Data

Jun. 24, 2021 (KR) .......................... 10-2021-0082501

(51) Int. Cl.
*G11C 16/26* (2006.01)
*G11C 5/14* (2006.01)
*G11C 16/08* (2006.01)
*G11C 16/34* (2006.01)

(52) U.S. Cl.
CPC .............. *G11C 16/26* (2013.01); *G11C 5/147* (2013.01); *G11C 16/08* (2013.01); *G11C 16/3431* (2013.01)

(58) Field of Classification Search
CPC ......... G11C 16/26; G11C 5/147; G11C 16/08; G11C 16/3431; G11C 16/24; G11C 16/0483; G11C 16/30; Y02D 10/00; G06F 3/0679
See application file for complete search history.

(56) References Cited

U.S. PATENT DOCUMENTS

2012/0254699 A1* 10/2012 Ruby .................. G11C 29/028
  714/E11.034
2019/0392907 A1* 12/2019 Her ....................... G06F 3/0659

* cited by examiner

*Primary Examiner* — Xiaochun L Chen
(74) *Attorney, Agent, or Firm* — IP & T GROUP LLP

(57) ABSTRACT

Disclosed are a non-volatile memory device, a memory system including the same and a read method of the memory system, in which the non-volatile memory device includes a first storage in which a basic offset level for a read retry operation is stored, a second storage in which an additional offset level for the read retry operation is stored, and a voltage generator suitable for adjusting, when the read retry operation is performed, a read voltage by using the basic offset level and further by selectively using the additional offset level depending on a read operation.

22 Claims, 4 Drawing Sheets

NON-VOLATILE MEMORY DEVICE, MEMORY SYSTEM INCLUDING THE SAME AND READ METHOD OF MEMORY SYSTEM

CROSS-REFERENCE TO RELATED APPLICATION(S)

This application is a continuation of U.S. patent application Ser. No. 17/559,243 filed on Dec. 22, 2021, which claims priority under 35 U.S.C. § 119 to Korean Patent Application No. 10-2021-0082501, filed on Jun. 24, 2021, the disclosure of which is incorporated herein by reference in its entirety.

BACKGROUND

1. Field

Various embodiments of the present disclosure relate to a semiconductor design technique, and more particularly, to a non-volatile memory device, a memory system including the same and a read method of the memory system.

2. Description of the Related Art

A semiconductor memory device may be classified into a volatile memory device such as a DRAM and a non-volatile memory device such as a flash memory. The volatile memory device loses data stored therein when power is cut off, but the non-volatile memory device retains data stored therein even when power is cut off. Particularly, a flash memory has advantages such as high programming speed, low power consumption and large-capacity data storage, and thus is widely used as a storage medium in computer systems and the like.

A flash memory includes a memory cell array that stores data. The memory cell array includes a plurality of memory blocks, each of the memory blocks includes a plurality of pages, and each of the pages includes a plurality of memory cells. The flash memory having the above-described configuration performs an erase operation in units of memory blocks and a write or read operation in units of pages.

SUMMARY

Various embodiments of the present disclosure are directed to a non-volatile memory device that supports a normal read operation and a cache read operation, a memory system including the non-volatile memory device, and a read method of the memory system.

In accordance with an embodiment of the present disclosure, a non-volatile memory device may include: a first storage in which a basic offset level for a read retry operation is stored; a second storage in which an additional offset level for the read retry operation is stored; and a voltage generator suitable for adjusting, when the read retry operation is performed, a read voltage by using the basic offset level and further by selectively using the additional offset level depending on a read operation.

The read operation may be a normal read operation or a cache read operation.

The voltage generator may use the basic offset level when the read operation is a normal read operation, and use the basic offset level and the additional offset level when the read operation is a cache read operation.

In accordance with an embodiment of the present disclosure, a memory system may include: a control device suitable for: generating a command signal and an address signal to control a read operation, determining whether the read operation has failed, based on read data, and generating a read failure flag signal as a result of the determination; and a non-volatile memory device suitable for: performing the read operation using a read voltage having a default level, based on the command signal and the address signal, generating the read data according to the read operation, and adjusting the read voltage by using different offset levels depending on the read operation when retrying the read operation based on the read failure flag signal.

The read operation may be a normal read operation or a cache read operation.

The non-volatile memory device may adjust the read voltage by using a basic offset level when the read operation is a normal read operation, and adjust the read voltage by using the basic offset level and an additional offset level when the read operation is a cache read operation.

In accordance with an embodiment of the present disclosure, a read method of a memory system may include: performing a read operation using a read voltage having a default level; determining whether the read operation has failed; applying, when the read operation has failed and is a cache read operation, a basic offset level and an additional offset level to the read voltage; and retrying the read operation using the read voltage.

The read method may further include applying, when the read operation has failed and is a normal read operation, the basic offset level to the read voltage.

The retrying of the read operation may include performing a normal read operation as the retry of the read operation.

The read method may further include repeating the applying and the retrying by adjusting the basic offset level while fixing the additional offset level.

In accordance with an embodiment of the present disclosure, a memory device may include: a memory cell array configured to store data therein; and a control circuitry configured to perform a read retry operation on the memory cell array by adjusting a read voltage by a predetermined amount, wherein the predetermined amount is configured by a first amount, which is variable, when the read retry operation is caused by a normal read operation and configured by both the first amount and a second amount which is fixed, when the read retry operation is caused by a cache read operation.

DETAILED DESCRIPTION

Various embodiments of the present disclosure are described below with reference to the accompanying drawings, in order to describe in detail the present disclosure so that those with ordinary skill in art to which the present disclosure pertains may easily carry out the technical spirit of the present disclosure.

It will be understood that when an element is referred to as being "connected to" or "coupled to" another element, the element may be directly connected to or coupled to the another element, or electrically connected to or coupled to the another element with one or more elements interposed therebetween. In addition, it will also be understood that the terms "comprises," "comprising," "includes," and "including" when used in this specification do not preclude the presence of one or more other elements, but may further include or have the one or more other elements, unless otherwise mentioned. In the description throughout the specification, some components are described in singular forms, but the present disclosure is not limited thereto, and it will be understood that the components may be formed in plural.

Figure 1:
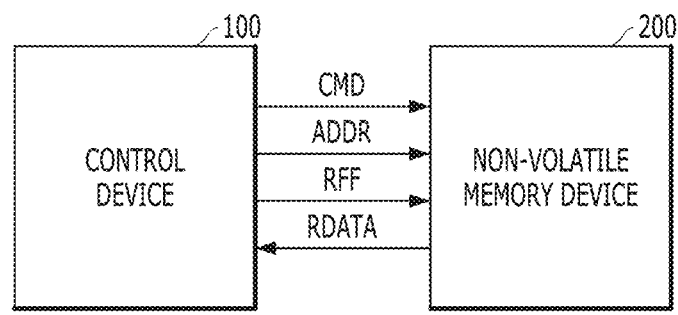
FIG. 1 is a block diagram illustrating a memory system in accordance with an embodiment of the present disclosure.

FIG. 1 is a block diagram illustrating a memory system in accordance with an embodiment of the present disclosure.

Referring to FIG. 1, the memory system may include a control device 100 and a non-volatile memory device 200.

The control device 100 may generate a command signal CMD and an address signal ADDR to control a read operation. The control device 100 may determine whether the read operation has failed, based on read data RDATA, and generate a read failure flag signal RFF corresponding to the determination result. For example, the control device 100 may determine whether the read operation has failed, by using an error correction code (ECC).

The non-volatile memory device 200 may perform the read operation using a read voltage RV having a default level, based on the command signal CMD, and generate the read data RDATA according to the read operation. The non-volatile memory device 200 may retry the read operation based on the read failure flag signal RFF. Particularly, when retrying the read operation, the non-volatile memory device 200 may adjust the read voltage RV by using a basic offset level OL1 or both of the basic offset level OL1 and an additional offset level OL2 according to the read operation.

The read operation may be one of a normal read operation and a cache read operation. The normal read operation and the cache read operation are described in detail below (refer to FIGS. 4 and 5).

Figure 2:
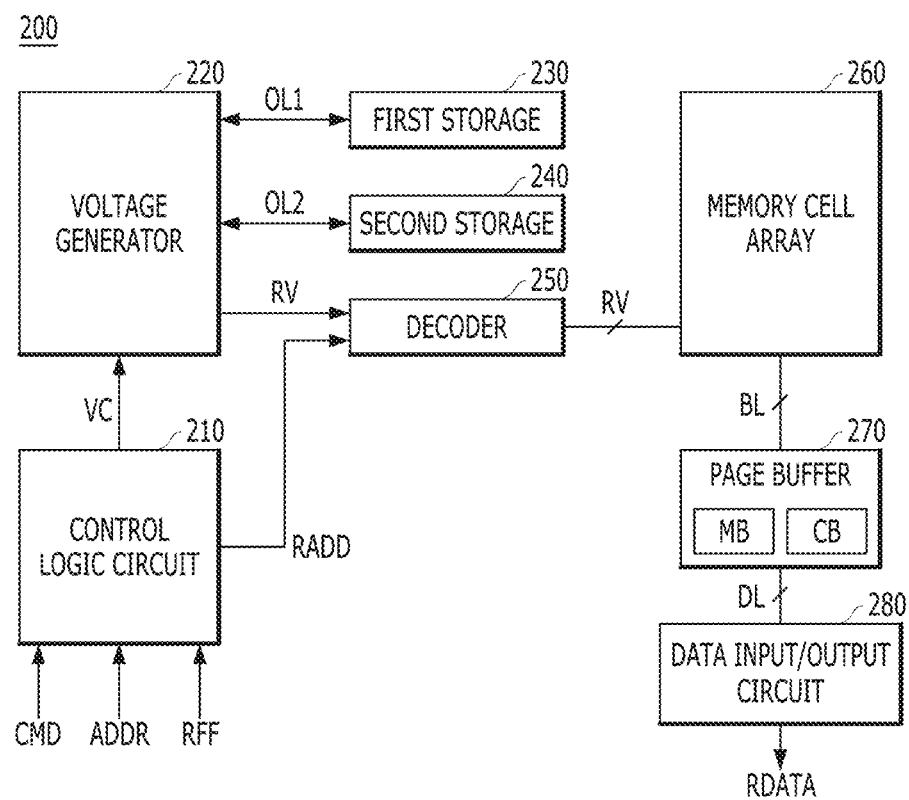
FIG. 2 is a block diagram illustrating a non-volatile memory device illustrated in FIG. 1 in accordance with an embodiment of the present disclosure.

FIG. 2 is a block diagram illustrating the non-volatile memory device 200 illustrated in FIG. 1 in accordance with an embodiment of the present disclosure.

Referring to FIG. 2, the non-volatile memory device 200 may include a control logic circuit 210, a voltage generator 220, a first storage 230, a second storage 240, a decoder 250, a memory cell array 260, a page buffer 270 and a data input/output circuit 280.

The control logic circuit 210 may generate a voltage control signal VC and a row address signal RADD based on the command signal CMD, the address signal ADDR and the read failure flag signal RFF.

The voltage generator 220 may generate the read voltage RV having the default level when the read operation is performed. The voltage generator 220 may adjust the read voltage RV based on a basic adjustment table or adjust the read voltage RV based on the basic adjustment table and an additional adjustment table, according to the read operation when the read operation is retried (hereinafter referred to as a "read retry operation"). For example, the voltage generator 220 may adjust the read voltage RV based on the basic adjustment table when the read operation is the normal read operation, and adjust the read voltage RV based on the basic adjustment table and the additional adjustment table when the read operation is the cache read operation.

The first storage 230 may store the basic adjustment table. The basic adjustment table may indicate the basic offset level OL1 according to the number of times that the read retry operation is performed. The basic offset level OL1 may have a positive value or a negative value. In the basic adjustment table, the basic offset level OL1 may gradually vary according to a number of retry times of the read retry operation.

The second storage 240 may store the additional adjustment table. The additional adjustment table may indicate the single additional offset level OL2 according to the read retry operation. The additional offset level OL2 may have a positive value or a negative value. In the additional adjustment table, the additional offset level OL2 may be fixed regardless of the number of retry times for the read retry operation.

The decoder 250 may apply the read voltage RV to the memory cell array 260 according to the row address signal RADD. For example, the read voltage RV may have the default level during the read operation, and have a level different from the default level, i.e., an adjusted level, during the read retry operation. The adjusted level may be a sum of the default level and the basic offset level OL1, or be a sum of the default level, the basic offset level OL1 and the additional offset level OL2.

The memory cell array 260 may include memory cells. The memory cell array 260 may be coupled to the decoder 250 through row lines RL, and be coupled to the page buffer 270 through bit lines BL. The row lines RL may include a drain selection line DSL, word lines WL1 to WL16, a source selection line SSL and a source line SL, which are described below. The read voltage RV may be applied through a word line selected from among the word lines WL1 to WL16.

During the read operation, the page buffer 270 may receive data from memory cells of a selected page through the bit lines BL, and output the data to the data input/output circuit 280 through data lines DL. The page buffer 270 may include a main buffer MB and a cache buffer CB.

The data input/output circuit 280 may output the read data RDATA to the control device 100, based on the data inputted thereto through the data lines DL.

Figure 3:
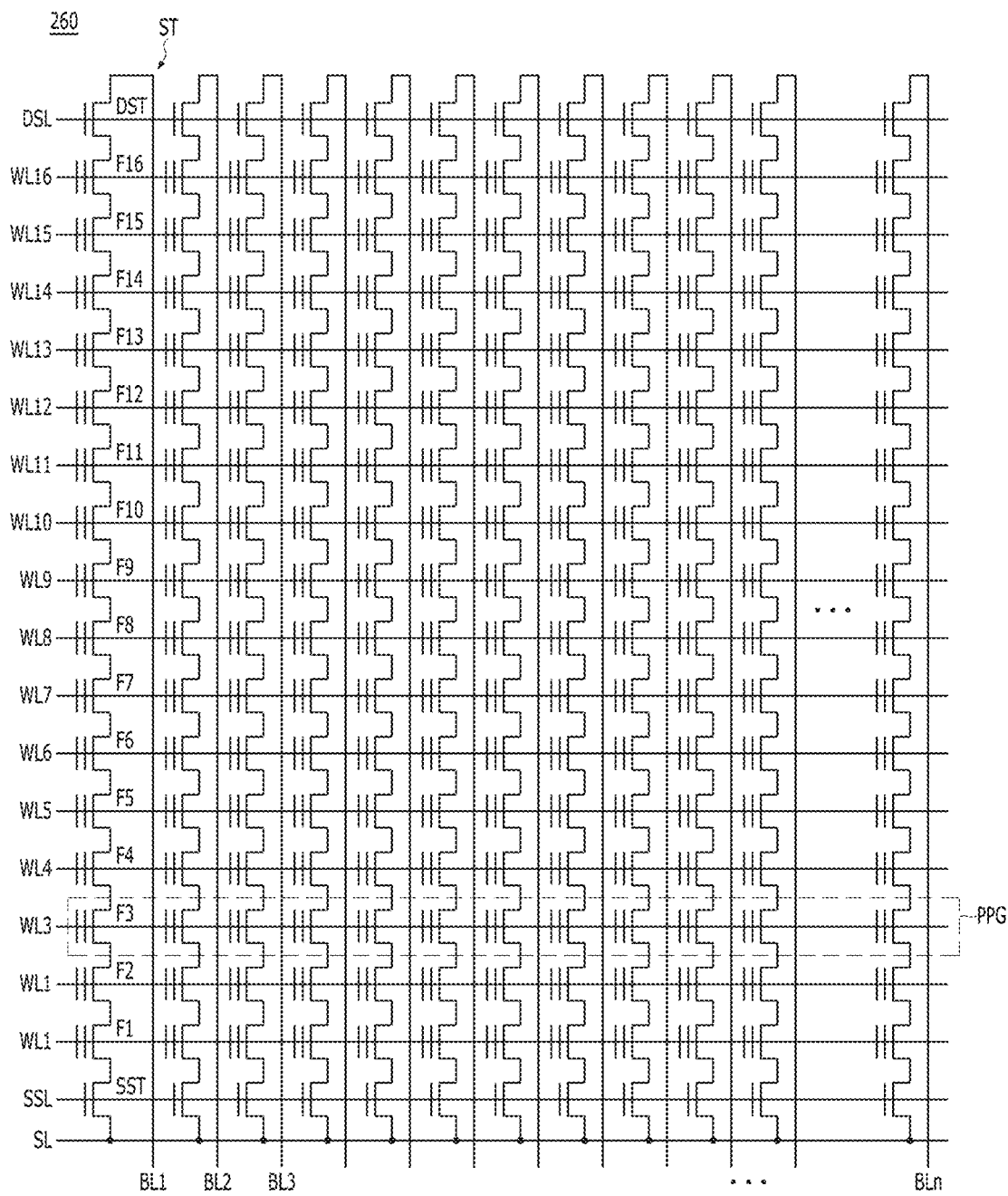
FIG. 3 is a circuit diagram illustrating an example of a memory cell array illustrated in FIG. 2 in accordance with an embodiment of the present disclosure.

FIG. 3 is a circuit diagram illustrating an example of the memory cell array 260 illustrated in FIG. 2 in accordance with with an embodiment of the present disclosure.

Referring to FIG. 3, the source selection line SSL, the word lines WL1 to WL16 and the drain selection line DSL arranged in parallel with one another may be coupled to the memory cell array 260. For example, the word lines WL1 to WL16 may be arranged in parallel with one another between the source selection line SSL and the drain selection line DSL.

More specifically, the memory cell array 260 may include strings connected between first to nth bit lines BL1 to BLn and the source line SL. The first to nth bit lines BL1 to BLn may be respectively coupled to the strings, and the source line SL may be coupled to the strings in common. Since the strings may have the same configuration, a string ST connected to the first bit line BL1 is representatively described in detail.

The string ST may include a source selection transistor SST, memory cells F1 to F16 and a drain selection transistor DST connected in series between the source line SL and the first bit line BL1. At least one source selection transistor SST and at least one drain selection transistor DST may be included in one string ST, and more memory cells than memory cells F1 to F16 illustrated in the drawing may be included in one string ST.

A source of the source selection transistor SST may be connected to the source line SL, and a drain of the drain selection transistor DST may be connected to the first bit line BL1. The memory cells F1 to F16 may be connected in series between the source selection transistor SST and the drain selection transistor DST. Gates of source selection transistors included in different strings may be connected to the source selection line SSL, gates of drain selection transistors included in different strings may be connected to the drain selection line DSL, and gates of memory cells F1 to F16 included in different strings may be connected to the plurality of word lines WL1 to WL16. A group of memory cells connected to the same word line among the memory cells included in different strings may be referred to as a physical page (PPG). Accordingly, as many physical pages as the number of word lines WL1 to WL16 may be included in the memory cell array 260.

Hereinafter, an operation of the memory system in accordance with an embodiment, which has the above-described configuration, is described with reference to FIGS. 4 to 6.

Figure 4:
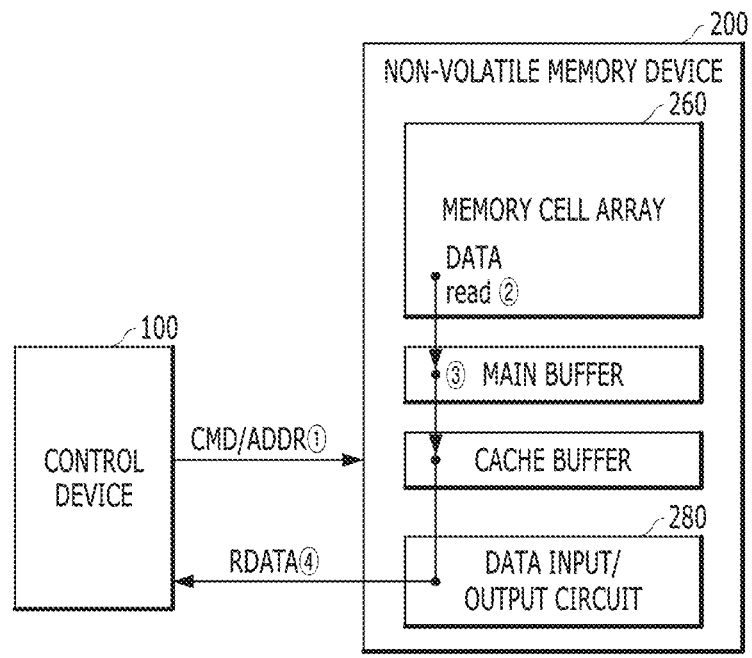
FIG. 4 is a diagram briefly illustrating a normal read operation in accordance with an embodiment of the present disclosure.

FIG. 4 is a diagram briefly illustrating the normal read operation in accordance with an embodiment of the present disclosure.

Referring to FIG. 4, the control device 100 may generate the command signal CMD and the address signal ADDR corresponding to the normal read operation, and transmit the generated signals to the non-volatile memory device 200 (①). The non-volatile memory device 200 may read the data DATA corresponding to the normal read operation from the memory cell array 260, based on the command signal CMD and the address signal ADDR, and store the data DATA in the main buffer MB (②). The data stored in the main buffer MB may be transmitted to the cache buffer CB (③). When the data transmitted to the cache buffer CB is transmitted to the data input/output circuit 280, the data input/output circuit 280 may output the read data RDATA to the control device 100 (④).

The normal read operation may include a series of processes of reading the data DATA from the memory cell array 260 in response to one command CMD and outputting the read data RDATA corresponding to the data DATA to the control device 100.

Figure 5:
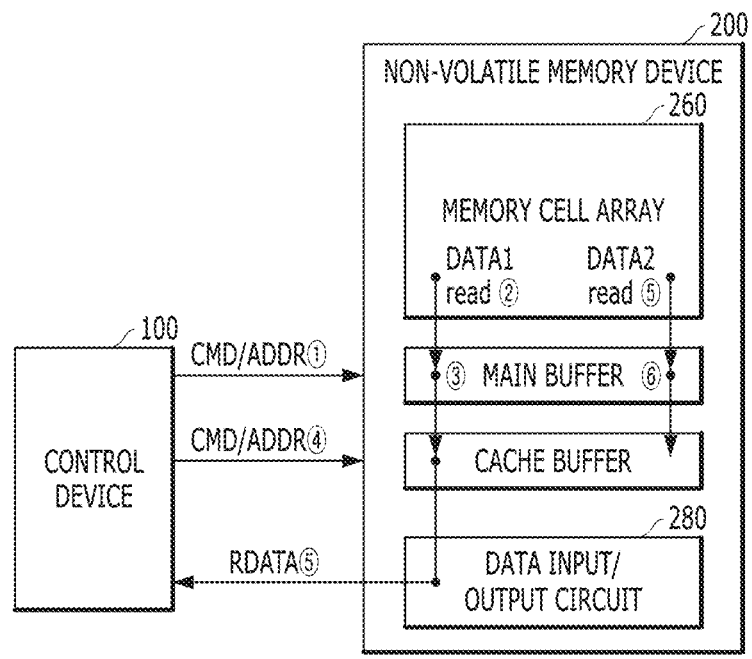
FIG. 5 is a diagram briefly illustrating a cache read operation in accordance with an embodiment of the present disclosure.

FIG. 5 is a diagram briefly illustrating the cache read operation in accordance with an embodiment of the present disclosure.

Referring to FIG. 5, the control device 100 may generate a first command signal CMD and a first address signal ADDR corresponding to the cache read operation (①). The non-volatile memory device 200 may read first data DATA1 corresponding to the cache read operation from the memory cell array 260, based on the first command signal CMD and the first address signal ADDR, and store the first data DATA1 in the main buffer MB (②). When the first data stored in the main buffer MB is transmitted to the cache buffer CB (③), a first cache read operation of the cache read operation may be completely performed.

Subsequently, the control device 100 may generate a second command signal CMD and a second address signal ADDR corresponding to the cache read operation (④). The non-volatile memory device 200 may read second data DATA2 corresponding to the cache read operation from the memory cell array 260, based on the second command signal CMD and the second address signal ADDR, and store the second data DATA2 in the main buffer MB (⑤). At the same time, the first data stored in the cache buffer CB may be outputted to the control device 100 as the read data RDATA through the data input/output circuit 280 (⑤). Subsequently, the second data stored in the main buffer MB may be stored in the cache buffer CB (⑥), and although not illustrated in the drawing, the second data stored in the cache buffer CB may be outputted to the control device 100 as the read data RDATA through the data input/output circuit 280.

The cache read operation may include a series of processes of reading current data, i.e., DATA2, from the memory cell array 260 in response to a current command signal and simultaneously outputting previous data, i.e., DATA1, corresponding to a previous command signal, to the control device 100. Accordingly, the cache read operation may implement higher read performance than the normal read operation. On the other hand, since the cache read operation is effective when the command signal CMD related to the read operation is continuously generated, the cache read operation may be more inefficient than the normal read operation when the command signal CMD related to the read operation and the command signal CMD related to the write operation are alternately generated. In brief, the reason is because the previous data, i.e., DATA1, stored in the cache buffer CB is outputted to the control device 100, and simultaneously, the current data, i.e., DATA2, read from the memory cell array 260 is stored in the cache buffer CB, and thus when the current command signal generated by the control device 100 is not related to the read operation, a separate command signal has to be generated to output the previous data, for example, DATA1, stored in the cache buffer CB before the current command signal is generated.

Although FIG. 5 illustrates an example in which, when the first cache read operation corresponding to the first command signal CMD and the first address signal ADDR is completely performed, the control device 100 generates the second command signal CMD and the second address signal ADDR, and transmits the generated signals to the non-volatile memory device 100, the present disclosure is not limited thereto, and a time point at which the control device 100 generates the second command signal CMD and the second address signal ADDR may be designed in various ways. For example, the control device 100 may generate the second command signal CMD and the second address signal ADDR at the time point at which the first data DATA1 is transmitted from the main buffer MB to the cache buffer CB. Alternatively, the control device 100 may generate the second command signal CMD and the second address signal ADDR before the first data DATA1 is transmitted from the main buffer MB to the cache buffer CB.

Figure 6:
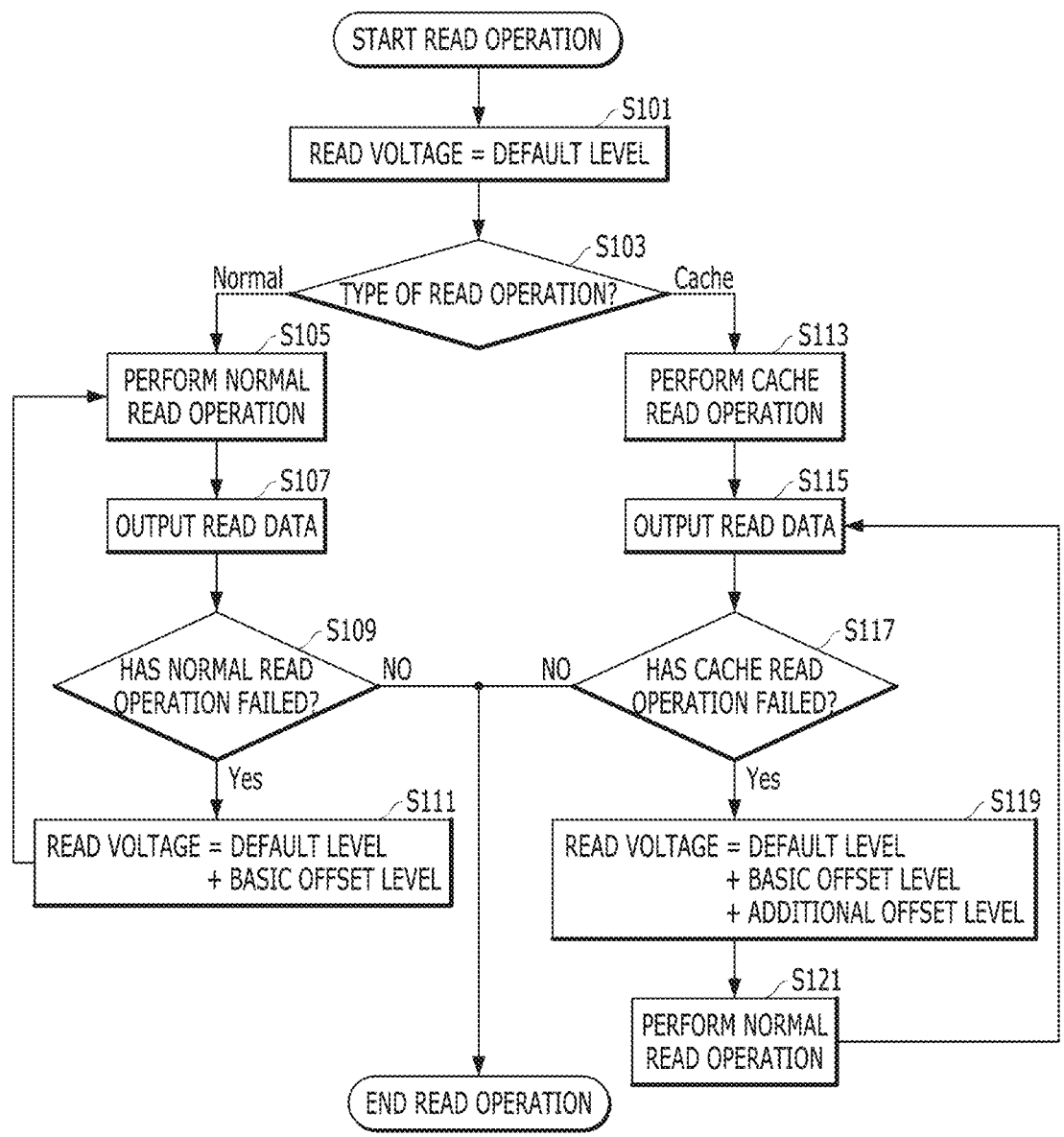
FIG. 6 is a flowchart illustrating a read operation of the memory system illustrated in FIG. 1 in accordance with an embodiment of the present disclosure.

FIG. 6 is a flowchart illustrating a read method of the memory system illustrated in FIG. 1 in accordance with an embodiment of the present disclosure.

First, a read method of the memory system according to the normal read operation is described.

Referring to FIG. 6, the control device 100 may generate the command signal CMD and the address signal ADDR corresponding to the normal read operation.

The non-volatile memory device 200 may generate the read voltage RV having the default level, based on the command signal CMD and the address signal ADDR, in operation S101. The non-volatile memory device 200 may determine that a current read operation is the normal read operation, based on the command signal CMD and the address signal ADDR, in operation S103, and perform the normal read operation in operation S105. The non-volatile memory device 200 may output the read data RDATA corresponding to the normal read operation to the control device 100, in operation S107.

The control device 100 may determine whether the normal read operation has failed, based on the read data RDATA, and generate the read failure flag signal RFF corresponding to the determination result, in operation S109. For example, the control device 100 may determine whether the normal read operation has failed, by using the error correction code ECC.

The non-volatile memory device 200 may retry the normal read operation when the normal read operation has failed, based on the read failure flag signal RFF. For example, the non-volatile memory device 200 may determine that the current read operation is the normal read operation, and adjust the read voltage RV by using the basic offset level OL1, in operation S111. In this case, the read voltage RV may have the sum level of the default level and the basic offset level OL1. The non-volatile memory device 200 may additionally perform the normal read operation when performing the read retry operation, in operation S105.

When the normal read operation is performed, the above-described operations S105, S107, S109 and S111 may be repeated at least once depending on whether the normal read operation has failed. For example, when the operations S105, S107, S109 and S111 are repeated at least twice, the basic offset level OL1 may gradually increase or decrease. Since the basic offset level OL1 according to the number of times that the read retry operation is performed is stored in the basic adjustment table, the basic offset level OL1 may be determined based on the basic adjustment table.

Next, a read method of the memory system according to the cache read operation is described.

Continuously referring to FIG. 6, the control device 100 may generate the command signal CMD and the address signal ADDR corresponding to the cache read operation.

The non-volatile memory device 200 may generate the read voltage RV having the default level, based on the command signal CMD and the address signal ADDR, in operation S101. The non-volatile memory device 200 may determine that a current read operation is the cache read operation, based on the command signal CMD and the address signal ADDR, in operation S103, and perform the cache read operation in operation S113. The non-volatile memory device 200 may output the read data RDATA corresponding to the cache read operation to the control device 100, in operation S115.

The control device 100 may determine whether the cache read operation has failed, based on the read data RDATA, and generate the read failure flag signal RFF corresponding to the determination result, in operation S117. For example, the control device 100 may determine whether the read operation has failed, by using the error correction code (ECC).

The non-volatile memory device 200 may retry the read operation, based on the read failure flag signal RFF. For example, the non-volatile memory device 200 may determine that the current read operation is the cache read operation, and adjust the read voltage RV by using the basic offset level OL1 and the additional offset level OL2, in operation S119. In this case, the read voltage RV may have the sum level of the default level, the basic offset level OL1 and the additional offset level OL2. As described with reference to FIG. 5, the cache read operation may be more affected by noise than the normal read operation by outputting data, for example, DATA1, and simultaneously, reading data, for example, DATA2. For example, since ground bouncing occurs when the data, for example, DATA1, is outputted and the source line SL and a ground supply terminal are connected to each other when the data, for example, DATA2, is read, the noise caused by the ground bouncing may affect the data to be read, for example, DATA2. The additional offset level OL2 may be an offset level for correcting the noise. The non-volatile memory device 200 may perform the normal read operation according to the adjusted read voltage RV as the read retry operation, in operation S121.

When the cache read operation is performed, the above-described operations S115, S117, S119 and S121 may be repeated at least once depending on whether the cache read operation has failed, that is, whether the read retry operation is performed. For example, when the operations S115, S117, S119 and S121 are repeated at least twice, the basic offset level OL1 may gradually increase or decrease, and the additional offset level OL2 may be fixed, that is, maintained. Since the basic offset level OL1 according to the number of times that the read retry operation is performed is stored in the basic adjustment table, and the additional offset level OL2 is stored in the additional adjustment table, the basic offset level OL1 may be determined based on the basic adjustment table, and the additional offset level OL2 may be determined based on the additional adjustment table.

According to the present embodiment, an offset level suitable for the cache read operation may be applied when the read retry operation according to the read failure is performed, and a basic offset level used for the normal read operation may be shared when the cache read operation is performed. Accordingly, the capacity of the second storage may be reduced.

According to an embodiment of the present disclosure, operational reliability of a cache read operation may be improved, and resource consumption according to the cache read operation may be minimized.

While the present disclosure has been illustrated and described with respect to specific embodiments, the disclosed embodiments are provided for description, and are not intended to be restrictive. Further, it is noted that the present disclosure may be achieved in various ways through substitution, change, and modification that fall within the scope of the following claims, as those skilled in the art will recognize in light of the present disclosure. Furthermore, the embodiments may be combined to form additional embodiments.

What is claimed is:

1. An apparatus comprising:
   a plurality of memory cells;
   a first storage storing a first adjustment table for adjusting a read voltage using a first offset level, the first adjustment table shared by both a first read operation and a second read operation; and
   a second storage storing a second adjustment table for adjusting the read voltage using a second offset level, the second adjustment table being dedicated to the second read operation,
   wherein, when a read retry operation is performed on the plurality of memory cells, the read voltage for the read retry operation is adjusted differently depending on whether the read retry operation is the first read operation or the second read operation.

2. The apparatus of claim 1, wherein the read voltage for the read retry operation is adjusted by adding the first offset level to the second offset level when the read retry operation is the second read operation.

3. The apparatus of claim 2, wherein the first offset level is a basic offset level, and the second offset level is an additional offset level for compensating ground bouncing noise affecting data reading.

4. The apparatus of claim 2, wherein the first read operation is a normal read operation, and the second read operation is a cache read operation.

5. The apparatus of claim 2, wherein the read retry operation is repeated with changing the first offset level while fixing the second offset level.

6. An apparatus comprising:
a plurality of memory cells;
a controller configured to generate a command signal for a read operation on the plurality of memory cells;
a first storage storing a first adjustment table for adjusting a read voltage using a first offset level;
a second storage storing a second adjustment table for adjusting the read voltage using a second offset level; and
a voltage generator configured to adjust the read voltage by using the first adjustment table and selectively using the second adjustment table based on the command signal, when a read retry operation after a failure of the read operation on the plurality of memory cells is performed.

7. The apparatus of claim 6, wherein the command signal identifies whether the read operation is a first type of read operation or a second type of read operation.

8. The apparatus of claim 7, wherein the first type of read operation is a normal read operation, and the second type of read operation is a cache read operation.

9. The apparatus of claim 8, wherein the read voltage for the read retry operation is adjusted by adding the first offset level to the second offset level when the read retry operation is the cache read operation.

10. The apparatus of claim 6, wherein the first offset level is a basic offset level, and the second offset level is an additional offset level for compensating noise affecting data reading.

11. The apparatus of claim 6, wherein the read retry operation is repeated by changing the first offset level and fixing the second offset level.

12. A method of operating a memory system, comprising:
performing a read operation using a read voltage having a default level;
determining whether the read operation has failed; and
performing a read retry operation after failure of the read operation using an adjusted read voltage which is adjusted from the default read voltage with an offset level,
wherein the adjusted read voltage for the read retry operation is set differently depending on whether the read operation is a first read operation or a second read operation, and
wherein the memory system includes a first storage and a second storage, the first storage storing a first adjustment table for adjusting the read voltage using a first offset level, the first adjustment table shared by both the first read operation and the second read operation, and the second storage storing a second adjustment table for adjusting the read voltage using a second offset level, the second adjustment table being dedicated to the second read operation.

13. The method of claim 12, wherein the adjusted read voltage is set by adding the first offset level to the second offset level when the read retry operation is the second read operation.

14. The method of claim 13, wherein the first read operation is a normal read operation, and the second read operation is a cache read operation.

15. The method of claim 14, further comprising repeating the read retry operation by changing the first offset level and fixing the second offset level.

16. The method of claim 13, wherein the first offset level is a basic offset level, and the second offset level is an additional offset level for compensating ground bouncing noise affecting data reading.

17. A memory system, comprising:
a memory device configured to perform a read operation including a normal read operation and a cache read operation, and configured to adjust a read voltage for the read operation; and
a control device configured to control the memory device to perform the read operation and to determine whether the read operation has failed,
wherein the read voltage is adjusted with a different offset level depending on whether the read operation is the normal read operation or the cache read operation.

18. The memory system of claim 17, wherein the memory device uses the adjusted read voltage when the control device determines that the read operation has failed.

19. The memory system of claim 17, wherein the read voltage is adjusted using a first offset level when the read operation is the normal read operation, and the read voltage is adjusted using a second offset level different with the first offset level when the read operation is the cache read operation.

20. The memory system of claim 19, wherein the first offset level is a basic offset level, and the second offset level is an additional offset level for compensating noise affecting data reads, and
wherein, when the read operation is the cache read operation, the read voltage is adjusted by adding the first offset level to the second offset level.

21. The memory system of claim 19, wherein the read retry operation is repeated by changing the first offset level and fixing the second offset level.

22. An apparatus comprising:
a plurality of memory cells;
a first storage storing a first adjustment table for adjusting a read voltage using a first offset level; and
a second storage storing a second adjustment table for adjusting the read voltage using a second offset level,
wherein, when a read retry operation is performed on the plurality of memory cells,
the read voltage for the read retry operation for the first read operation adjusts the read voltage based on a number of retry times, and
the read voltage for the read retry operation for the second read operation applies a fixed offset to the read voltage regardless of the number of retry times.

* * * * *